US005496182A

United States Patent [19]
Yasumura

[11] Patent Number: 5,496,182
[45] Date of Patent: Mar. 5, 1996

[54] CONNECTOR DEVICE FOR ELECTRICALLY INTERCONNECTING PRINTED CIRCUIT BOARD LIKE MEMBERS

[75] Inventor: Gary Yasumura, Santa Clara, Calif.

[73] Assignee: Beta Phase, Inc., Menlo Park, Calif.

[21] Appl. No.: 418,428

[22] Filed: Apr. 7, 1995

Related U.S. Application Data

[62] Division of Ser. No. 98,785, Jul. 29, 1993, abandoned.

[51] Int. Cl.$^6$ .................................................. H01R 23/68
[52] U.S. Cl. .................................................. 439/62; 439/67
[58] Field of Search ........................... 439/67, 267, 493, 439/62

[56] References Cited

U.S. PATENT DOCUMENTS

| | | | |
|---|---|---|---|
| 3,887,255 | 6/1975 | Codrino | 439/496 |
| 3,887,260 | 6/1975 | Codrino | 439/496 |
| 4,252,389 | 2/1981 | Olsson | 439/65 |
| 4,621,882 | 11/1986 | Krumme | 439/161 |
| 4,643,500 | 2/1987 | Krumme | 439/161 |
| 4,645,489 | 2/1987 | Krumme et al. | 604/65 |
| 4,713,063 | 12/1987 | Krumme | 604/250 |
| 4,734,047 | 3/1988 | Krumme | 439/161 |
| 4,773,680 | 9/1988 | Krumme | 285/381 |
| 4,824,391 | 4/1989 | Ii | 439/67 |
| 4,911,643 | 3/1990 | Perry et al. | 439/67 |
| 4,911,653 | 3/1990 | Walton et al. | 439/326 |
| 5,092,781 | 3/1992 | Casciotti et al. | 439/62 |
| 5,163,835 | 11/1992 | Morlion et al. | 439/67 |
| 5,195,897 | 3/1993 | Kent et al. | 439/67 |

FOREIGN PATENT DOCUMENTS 1522029 8/1978 United Kingdom .

OTHER PUBLICATIONS

IBM Bulletin, "Printed Circuit Connector", vol. 7, No. 3, Aug. 1964, p. 182.
IBM Technical Disclosure Bulletin, vol. 7, No. 3, Aug., 1994, J. P. G. Dunman, "*Printed Circuit Connector*", p. 182.

Primary Examiner—Gary F. Paumen
Attorney, Agent, or Firm—Burns, Doane, Swecker & Mathis

[57] ABSTRACT

A connector device for being mounted on a first printed circuit board like member to establish electrical connection between electrical contacts on the first printed circuit board like member and electrical contacts on a second printed circuit board like member includes a biasing element and flexible circuitry attached to the biasing element. The flexible circuitry is provided with a plurality of generally parallel-spaced electrical conductors for being electrically mated with electrical contacts on the first printed circuit board like member. To provide movement of individual ones of the electrical conductors relative to adjacent electrical conductors, the biasing member can be provided with slits or slots at places between the electrical conductors. In addition, or alternatively, slits or slots can be provided in the flexible circuitry. In another embodiment, the biasing element can be comprised of a plurality of individual biasing members that are aligned with the electrical conductors on the flexible circuitry. The connector device can also be provided with slots or slits adjacent the leads which are to be electrically connected with the electrical contacts on the first printed circuit board like member.

1 Claim, 9 Drawing Sheets

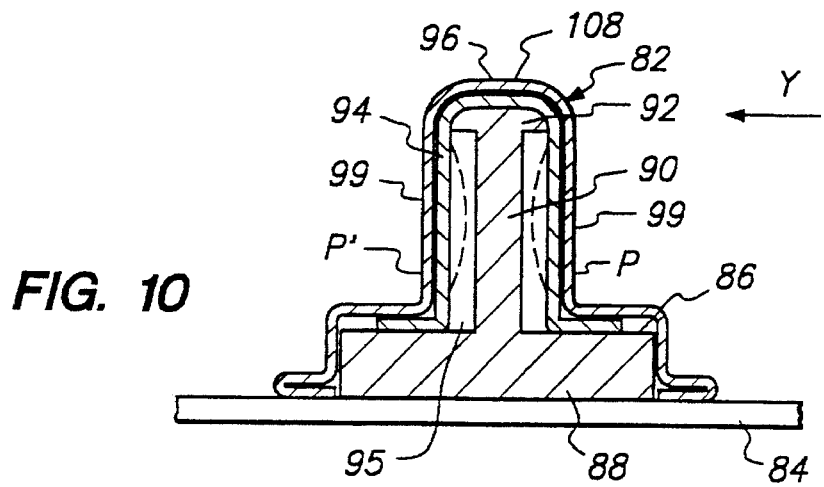
FIG. 10
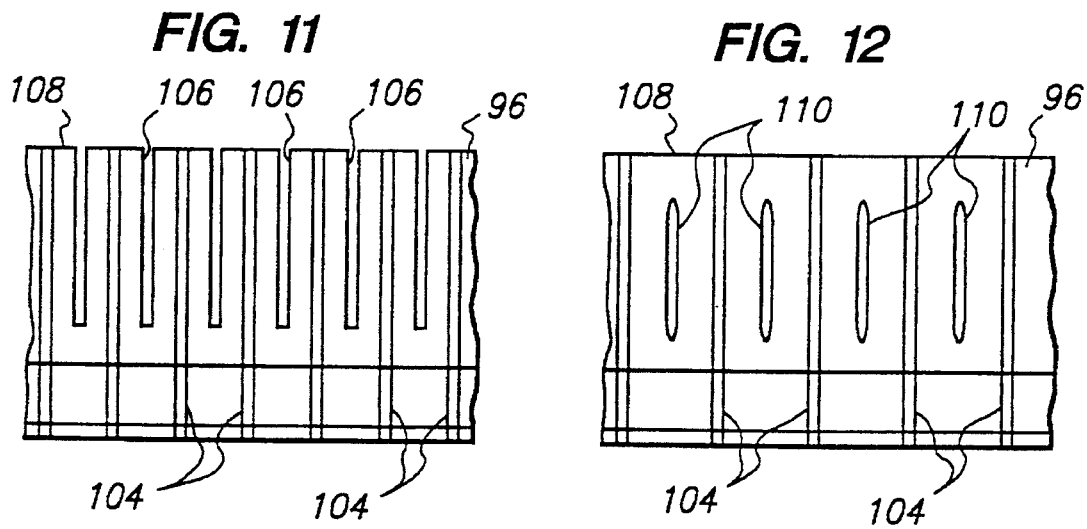
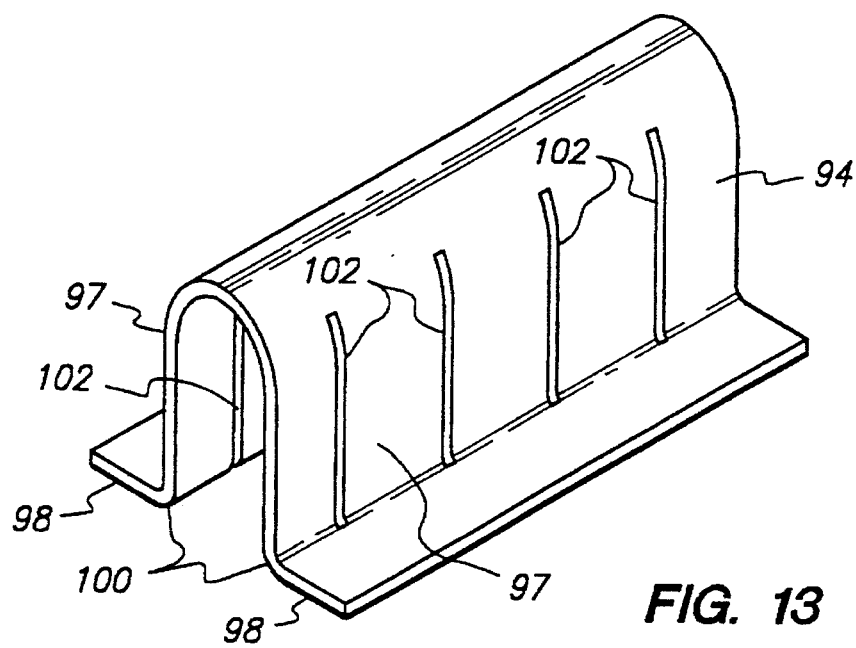

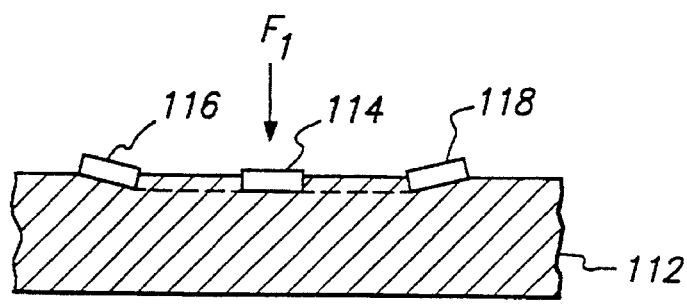
FIG. 14
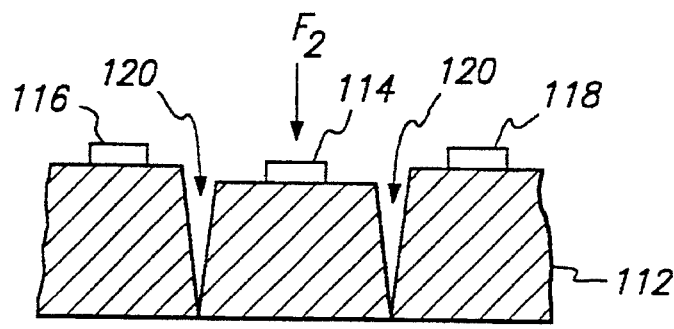
FIG. 15
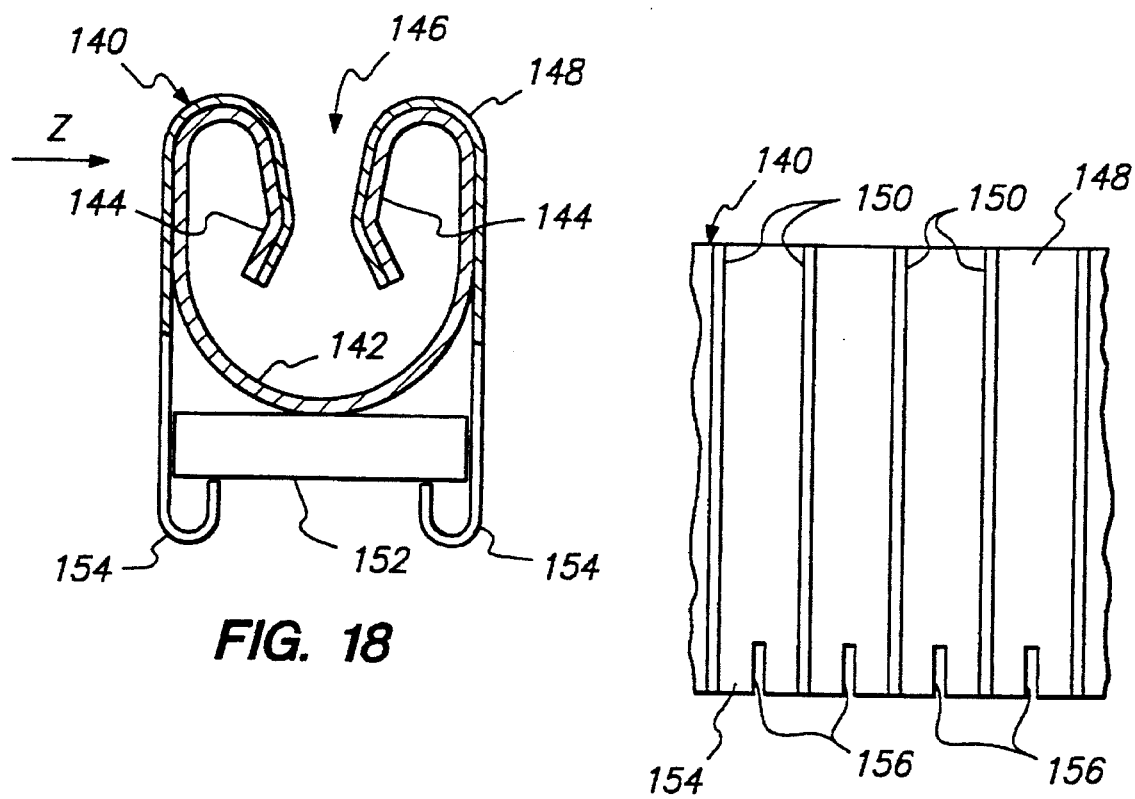
FIG. 18
FIG. 19

CONNECTOR DEVICE FOR ELECTRICALLY INTERCONNECTING PRINTED CIRCUIT BOARD LIKE MEMBERS

This application is a divisional of application No. 08/098,785, filed Jul. 29, 1993, now abandoned.

BACKGROUND OF THE INVENTION

1. Field of the Invention

The invention relates to connector devices for use in conjunction with printed circuit boards and more particularly to connector devices for establishing an electrical connection between two printed circuit boards or the like.

2. Related Art

Printed circuit boards and the like are oftentimes provided with an arrangement that allows another circuit board or the like to be electrically connected thereto. For example, a motherboard can be outfitted to allow a daughterboard to be electrically connected thereto, or a backplane board can be outfitted to allow a plug-in board to be electrically connected thereto. FIG. 1 illustrates one such arrangement for electrically interconnecting one printed circuit board with another printed circuit board.

As seen in FIG. 1, an existing printed circuit board 20 (e.g., a motherboard or backplane board) has a connector element 22 mounted thereon. The connector element 22 includes a biasing member 24 and flexible circuitry 26 disposed on the biasing member 24. As seen in FIGS. 2 and 3, the flexible circuitry 26 is provided with a plurality of generally parallel-spaced electrical conductors 28.

With reference once again to FIG. 1, the biasing member 24 is elongated and generally C-shaped with two arm portions 30 that extend along the longitudinal extent of the biasing member 24. The arm portions 30 are spaced apart to define an opening 32 that extends along the longitudinal extent of the connector element 22. The longitudinally extending opening 32 is adapted to receive a printed circuit board 34 or the like.

As seen in FIG. 3, the printed circuit board-like member 34 that is to be inserted into the opening 32 is provided with a plurality of spaced apart electrical contacts 36 that are adapted to cooperate with the electrical conductors 28 on the flexible circuitry 26.

The biasing member 24 can be fabricated from any resilient, spring-like material, such as beryllium copper. The biasing member 24 is designed such that the arm portions 30 provide a biasing force towards one another when the printed circuit board-like member 34 is inserted into the opening 32 between the arm portions 30. Further details associated with the use of a connector member comprised of a combination of flexible circuitry and a biasing member are described, for example, in U.S. Pat. No. 5,195,897, the disclosure of which is incorporated herein by reference.

The connector element 22 can be secured to a mounting block 38 in any suitable manner for purposes of mounting the connector element 22 on the printed circuit board-like member 20. In addition, the ends of the flexible circuitry 26 distal from the arm portions 30 can be provided with leads 40. The leads 40 can be soldered to solder leads or pads (not shown) on the printed circuit board-like member 20 in order to provide electrical connection between the electrical conductors 28 on the flexible circuitry 26 and the electrical contacts (not shown) on the printed circuit board-like member 20. Alternatively, the leads 40 can be compression mounted to the printed circuit board-like member 20 to electrically mate the electrical conductors 28 on the flexible circuitry 26 to the electrical contacts (not shown) on the printed circuit board-like member 20.

As mentioned above, the opening 32 in the connector element 22 is adapted to receive a printed circuit board-like member 34 (e.g., a daughterboard or plug-in board) which has electrical contacts 36 on opposite sides thereof. When the printed circuit board-like member 34 is inserted into the opening 32 in the connector element 22, the electrical contacts 36 on the printed circuit board-like member 34 electrically mate with the electrical conductors 28 on the connector element 22 to thereby establish, by virtue of the electrical mating of the leads 40 with the electrical contacts on the printed circuit board-like member 20, electrical interconnection between the electrical contacts on the two printed circuit board-like member 20, 34.

Although the connector element 22 illustrated in FIGS. 1–3 is well suited for establishing electrical interconnection between two printed circuit board-like members 20, 34, the connector element 22 is susceptible of certain improvements. For example, in some instances, it may be difficult to achieve sufficient electrical contact between the electrical contacts 36 on the printed circuit board-like member 34 and the electrical conductors 28 on the flexible circuitry 26. To explain more fully and with reference to FIGS. 2 and 3, when the printed circuit board-like member 34 is inserted into the opening 32 in the connector element 22, the electrical contacts A', B', C' are designed to electrically mate with electrical conductors A, B, C, respectively on the flexible circuitry 26. If the electrical contact B' on the printed circuit board-like member 34 is recessed slightly with respect to the electrical contacts A', C' (i.e., is not precisely coplanar with respect to the electrical contacts A', C'), the electrical conductors A, C must be capable of being compressed slightly in order to ensure that the electrical conductor B electrically mates with the electrical contact B'. In one respect, it is difficult for the electrical conductors A, B, C to comply with or electrically mate with the electrical contacts A', B', C' on the printed circuit board-like member 34 because the biasing member, which provides the normal contact force, is made from a continuous shape. Typically, a compressible plastic-like material such as polyimide and acrylic adhesive are located between the flexible circuitry 26 and the biasing member 24, and that compressible plastic-like material does allow for some compressibility of the electrical conductors 28 on the flexible circuitry 26. However, if that compressible plastic-like material is not sufficiently compliant, or if a less compressible material is employed, or if the electrical contacts A', B', C' on the printed circuit board-like member 34 are excessively non-coplanar, it may be difficult to ensure that all of the electrical conductors 28 on the flexible circuitry 26 electrically mate with their respective electrical contacts 36 on the printed circuit board-like member 34. In such a situation, a failure may arise.

A related situation also exists with respect to the leads 40 on the flexible circuitry 26 that are to be electrically mated with the electrical contacts on the printed circuit board-like member 20. That is, if the electrical contacts on the printed circuit board-like member 20 are not substantially coplanar with respect to one another (i.e., some of the electrical contacts are elevationally higher or lower than other electrical contacts), it may be difficult to ensure adequate electrical mating of the electrical conductors 28 on the flexible circuitry 26 and the electrical contacts (not shown) on the printed circuit board-like member 20. When the connector element 22 is soldered or pressed down onto the printed circuit board-like member 20, the leads 40 must substantially conform to or lay on top of (i.e., within approximately 0.004") of the corresponding lands or pads (not shown) on the printed circuit board-like member 20. If that does not occur and too much space results between the leads 40 and the lands or pads on the printed circuit board-like member 20, an effective electrical bridge is not formed. Such a situation can arise when the surface of the printed circuit board-like member 20 is warped or when there are variations in elevational height of the lands or pads on the printed circuit board-like member 20.

In light of the foregoing, it would be advantageous and desirable to produce a connector element that allows individual electrical conductors on the flexible circuitry to move relative to one another to ensure an adequate and reliable electrical interconnection between the two printed circuit board-like members 20.

SUMMARY OF THE INVENTION

In accordance with one aspect of the present invention, a connector assembly for being mounted on a first printed circuit board like member to electrically interconnect the first printed circuit board like member to a second printed circuit board like member includes support means for providing a support and flexible circuitry disposed on the support means. The flexible circuitry includes generally parallel-spaced individual electrical conductors for being electrically connected to electrical contacts on the first printed circuit board like member. The electrical conductors are positioned to electrically mate with electrical contacts on the second printed circuit board like member when the second printed circuit board like member is mounted on the connector assembly. the connector assembly also includes means for allowing individual ones of the electrical conductors on the flexible circuitry to move relative to adjacent electrical conductors during mounting of the second printed circuit board like member on the connector assembly.

According to another embodiment of the invention, a connector plug for being mounted on a first printed circuit board like member and for receiving a connector receptacle mounted on a second printed circuit board like member in order to electrically interconnect the first printed circuit board like member and the second printed circuit board like member includes an elongated biasing member configured to have spaced apart sides and flexible circuitry mounted on the biasing member. The flexible circuitry includes generally parallel-spaced electrical conductors for being electrically mated to electrical contacts on the first printed circuit board like member when the connector plug is mounted on the first printed circuit board like member and for being electrically mated to electrical conductors on the connector receptacle when the connector receptacle is received on the connector plug. The flexible circuitry has sides that overlie the sides of the biasing member. The connector assembly is also provided with means for allowing individual ones of the electrical conductors on the flexible circuitry to move relative to adjacent electrical conductors on the flexible circuitry.

In accordance with a further aspect of the invention, a connector assembly for being mounted on a first printed circuit board like member to electrically interconnect the first printed circuit board like member to a second printed circuit board like member comprises on elongated biasing member provided with a longitudinally extending opening and arm portions disposed on opposite sides of the longitudinally extending opening, and flexible circuitry disposed on the biasing member. The flexible circuitry is provided with generally parallel-spaced electrical conductors for being electrically connected to electrical contacts on the first printed circuit board like member when the connector assembly is mounted on the first printed circuit board like member. The electrical conductors on the flexible circuitry have end leads that are to be brought into contact with lands on the first printed circuit board like member to establish an electrical connection between the electrical conductors on the flexible circuitry and the electrical contacts on the first printed circuit board like member. The connector plug also includes means positioned adjacent the end leads of the electrical conductors for allowing individual ones of the end leads to move relative to adjacent end leads to facilitate contact between each end lead and the respective land on the first printed circuit board like member.

According to another aspect of the invention, a connector assembly for being mounted on a first printed circuit board-like member and for receiving a second printed circuit board-like member to establish electrical connection between electrical contacts on the first printed circuit board-like member and electrical contacts on the second printed circuit board-like member includes a supporting base, an elongated biasing member mounted on the supporting base, and flexible circuitry mounted on the biasing member. The biasing member is provided with a longitudinal opening extending between opposite ends of the biasing member for receiving a second printed circuit board-like member, and arm portions positioned on opposite sides of the opening. The flexible circuitry includes generally parallel-spaced electrical conductors positioned on at least one side of the opening for being electrically connected with electrical contacts on the second printed circuit board-like member when the second printed circuit board-like member is inserted into the opening in the biasing member. At least one of the biasing member and the flexible circuitry is provided with a plurality of slits that are positioned at locations disposed between the electrical conductors.

In accordance with yet another aspect of the invention, a connector assembly for being mounted on a first printed circuit board-like member and for receiving a second printed circuit board-like member in order to establish an electrical connection between the first printed circuit board-like member and the second printed circuit board-like member comprises a plurality of nested biasing members and flexible circuitry attached to the nested biasing members. Each of the biasing members has oppositely positioned ends and oppositely positioned arms portions. The arm portions of each biasing member are spaced apart to define a longitudinally extending opening that extends between the ends of the biasing member, and the longitudinally extending opening in each of the biasing members is aligned with the longitudinally extending openings in the other biasing members to thereby receive a second printed circuit board like member. Each of the arm portions has a free end that is turned to provide a contact location. The flexible circuitry includes a plurality of generally parallel-spaced electrical conductors for being electrically connected to electrical contacts on the first printed circuit board-like member when the connector assembly is mounted on the first printed circuit board-like member. The flexible circuitry is disposed on the outermost biasing member and is disposed on the contact locations of each biasing member so that the electrical conductors on the flexible circuitry will electrically mate with electrical contacts on the second printed circuit board-like member when the second printed circuit board-like member is inserted into the aligned openings that extends along the longitudinal extent of each biasing member.

BRIEF DESCRIPTION OF THE DRAWING FIGURES

FIG. 10 is a cross-sectional view of an assembly plug in accordance with another aspect of the present invention;

FIG. 11 is a front view of the connector plug illustrated in FIG. 10 as seen in the direction of arrow Y in FIG. 10;

FIG. 12 is front view of the connector plug shown in FIG. 10 as seen in the direction of arrow Y in FIG. 10 illustrating an alternative embodiment;

FIG. 13 is a perspective view of the biasing member that could be employed in connection with the embodiment of the connector plug shown in FIG. 10;

FIG. 14 is a greatly enlarged cross-sectional view of the flexible circuitry when a force is applied to an electrical conductor;

FIG. 15 is a greatly enlarged cross-sectional view of the flexible circuitry in accordance with another embodiment of the present invention illustrating the behavior of adjacent electrical conductors when the flexible circuitry is provided with slots;

FIG. 18 is a cross-sectional view of a connector assembly in accordance with an additional embodiment of the present invention;

FIG. 19 is a front view of the connector assembly illustrated in FIG. 18 as seen in the direction of arrow Z in FIG. 18;

DETAILED DESCRIPTION OF THE PREFERRED EMBODIMENTS

Figure 2:
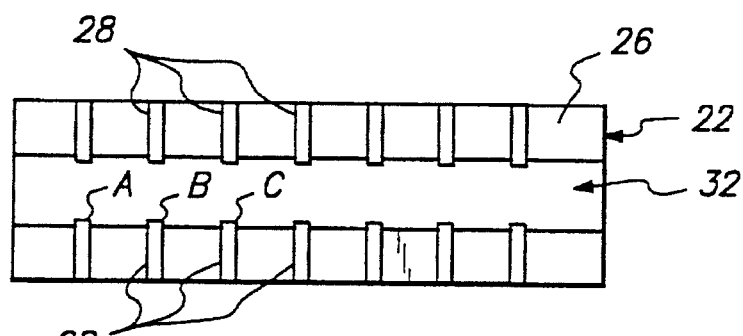
FIG. 2 is a top view of the connector element illustrated in FIG. 1.
Figure 3:
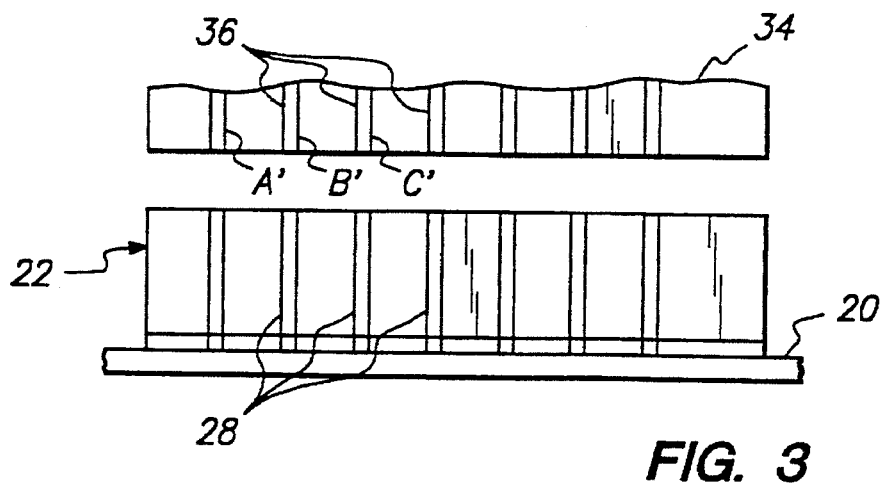
FIG. 3 is a front view of the connector element shown in FIG. 1 as seen in the direction of arrow X in FIG. 1.
Figure 4:
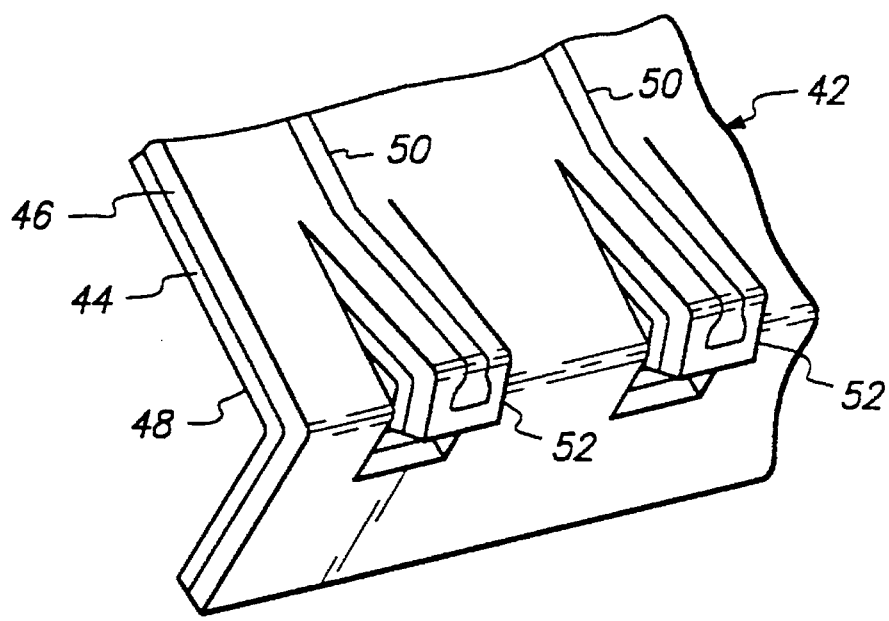
FIG. 4 is a perspective view of a portion of a connector assembly in accordance with one embodiment of the present invention.

With reference initially to FIG. 4, one embodiment of a connector assembly is illustrated. Although not specifically illustrated in FIG. 4, the connector assembly 42 is constructed, shaped and configured in much the same way as the connector element 22 illustrated in FIGS. 1–3. That is, the connector assembly 42 includes a generally C-shaped biasing member 44 made of resilient, spring-like material. The biasing member 44 is provided with spaced apart arms 48 that define a longitudinally extending opening that is adapted to receive a printed circuit board-like member, for example, a daughterboard or a plug-in board. The connector assembly 42 also includes flexible circuitry 46 that is disposed on the biasing member 44. The flexible circuitry 46 is provided with a plurality of generally parallel-spaced electrical conductors 50 having leads or contact elements that are adapted to be electrically mated with electrical contacts on a motherboard or backplane board. In addition, the electrical conductors 50 can include contact elements that are adapted to electrically mate with electrical contacts on a printed circuit board-like member (e.g., a daughterboard or plug-in board) which is inserted into the longitudinally extending opening provided between the arms 48. Pairs of contact elements are then interconnected with traces to define the electrical conductors 50.

As further seen in FIG. 4, the connector assembly 42 is provided with several punched-out or stamped-out cantilever elements which form individual spring members 52. The individual cantilever spring members 52 are preferably formed by punching or stamping completely through the biasing member 44 and the flexible circuitry 46. The spring members 52 are punched outwardly in a direction away from the biasing member 44 with respect to surrounding areas of the biasing member 44 and the flexible circuitry 46. Moreover, the spring members 52 are punched out at locations that correspond to the electrical conductors 50. More particularly, the cantilever spring members 52 are aligned with the contact elements which are adapted to mate with the electrical contacts on the printed circuit board like members (e.g., motherboard and daughterboard). In that way, each of the electrical contacts 50 is positioned on individual spring members 52. The cantilever spring members 52 are punched-out or stamped-out in such a way that they extend out of the plane defined by the adjoining portions of the connector assembly 42.

Although only two spring members 52 are illustrated in FIG. 4 for purposes of simplicity and ease of illustration, it is to be understood that the connector assembly 42 can be provided with spring members 52 that correspond in number to the number of electrical conductors 50 on the flexible circuitry 46. Further, although FIG. 4 illustrates the individual spring members 50 as being aligned with one another along the length of the connector assembly 42, it is to be understood that if the electrical conductors 50 are staggered in an up and down relation, the spring members 52 could be staggered in a corresponding manner. Further, it is within the scope of the present invention that more than one electrical conductor could be positioned on a single spring member 52.

By providing the connector assembly 42 with a plurality of spring members 52 as illustrated in FIG. 4, the individual spring members 52 can move relative to one another. Consequently, individual ones of the electrical conductors 50 (i.e., the contact members) can move relative to adjacent electrical conductors 50, thereby compensating for variations between the various electrical contacts on the printed circuit board-like member that is inserted into the longitudinally extending opening defined between the arms 48 of the connector assembly 42. In other words, to the extent that all of electrical contacts on the printed circuit board like member may not be positioned in a common plane, the spring members 52 and the associated electrical conductors 50 are able to easily and readily move relative to other electrical conductors 50 on the flexible circuitry 46 to ensure contact between each of the electrical conductors 50 and its respective electrical contact on the printed circuit board like member. Thus, individualized compliant contact can be achieved with respect to each of the electrical conductors 50 and the corresponding electrical contact on the daughterboard or plug-in board.

An additional advantage associated with the connector assembly 42 shown in FIG. 4 is the wiping action that is produced when a daughterboard or plug-in board in inserted into the longitudinally extending opening located between the arms 48. That is, when the daughterboard or plug-in board is inserted into the opening in the connector assembly 42, the electrical contacts on the daughterboard or plug-in board wipe against the electrical conductors 50 on the connector assembly 42, thereby wiping away any deposits that may be present on the electrical conductors 50 of the connector assembly 42 or the electrical contacts on the daughterboard or plug-in board. Consequently, a more effective electrical contact can be achieved.

Figure 5:
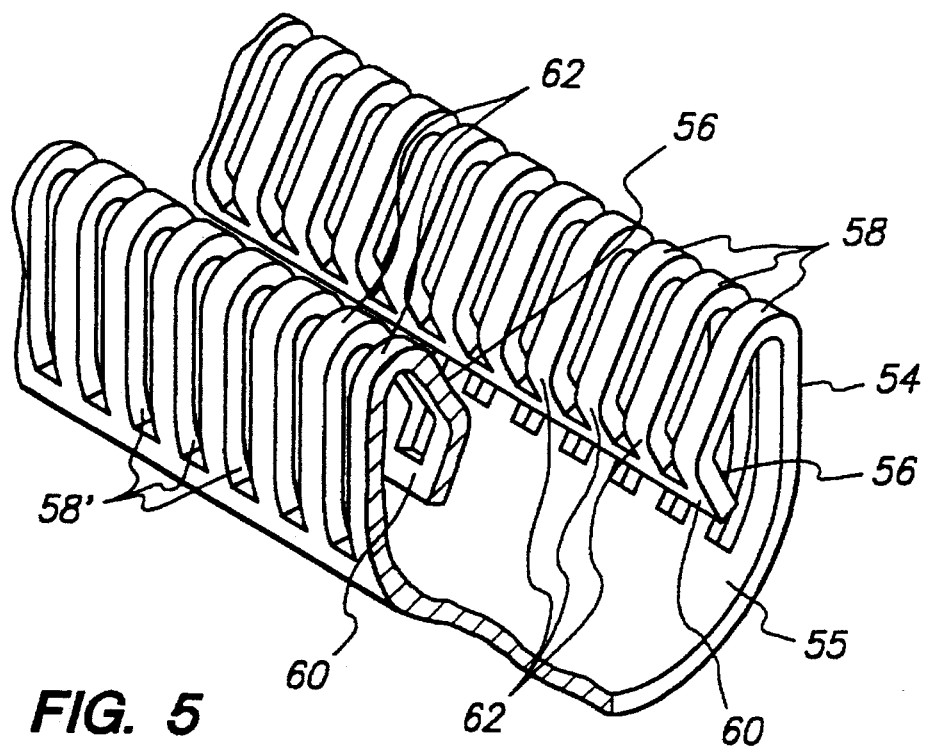
FIG. 5 is a perspective view, partially cut away, illustrating, in accordance with another embodiment of the invention, a configuration of the biasing member.

FIG. 5 illustrates another embodiment of the connector assembly according to the present invention for achieving movement of individual ones of the electrical conductors on the flexible circuitry. In particular, FIG. 5 illustrates an alternative embodiment for the biasing member 54. As in the case of the connector element 22 illustrated in FIGS. 1–3, the biasing member 54 is defined by an elongated generally C-shaped element of resilient spring-like material. The biasing member 54 is provided with oppositely positioned arms 56 that are spaced apart from one another to define a longitudinally extending opening for receiving a printed circuit board-like member (e.g., a daughterboard or plug-in board).

In the embodiment shown in FIG. 5, the biasing member 54 is provided with a plurality of slots 58, 58'. The slots 58, 58' extend completely through the biasing member 54 (i.e., from the outwardly facing surface to the inwardly facing surface). In the illustrated embodiment, the slots 58, 58' extend from a region adjacent the base 55 portion of the biasing member 54 to a point adjacent the free end 60 of the arm portions 56. As seen, the slots 58, 58' extend up to, but stop short of, the free ends 60 of the arm portions 56. Further, the slots 58 extending through the arm portion on one half of the biasing member 54 do not connect with the slots 58' extending through the arm portions 56 on the other half of the biasing member 54. In that way, the free end 60 of each arm portion 56 remains unslotted as does the base portion 55 of the biasing member 54.

Figure 1:
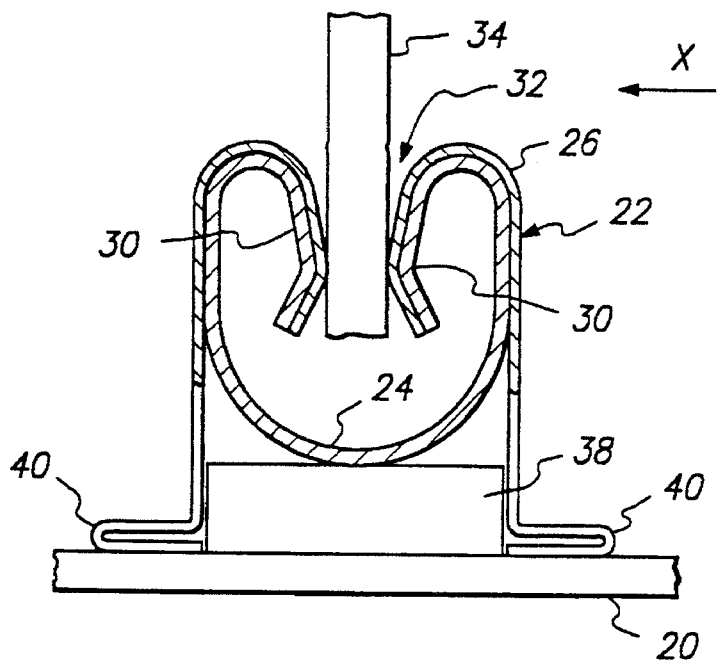
FIG. 1 is a cross-sectional view of a connector element illustrating the way in which it is mounted on a motherboard or backplane board and illustrating the way in which it receives a daughterboard or plug-in board.

As can be appreciated, the slots 58, 58' define a plurality of individual spring elements 62. Although not specifically illustrated in FIG. 5, flexible circuitry is attached to the biasing member 54 in much the same way as illustrated in FIG. 1. Preferably, the flexible circuitry is disposed on the biasing member 54 in such a way that the electrical conductors on the flexible circuitry are aligned with the individual spring elements 62 of the biasing member 54.

Figure 5A:
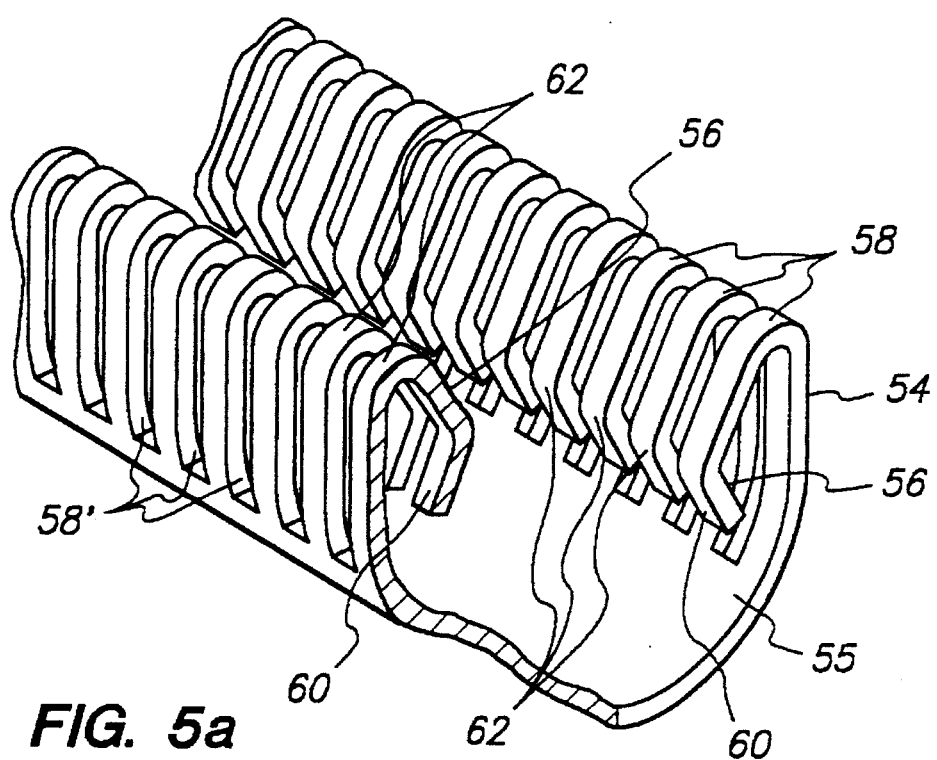
FIG. 5(a) is a perspective view, partially cut away, illustrating a configuration of the biasing member in accordance with another embodiment of the invention.

As noted above, in the FIG. 5 embodiment, the slots 58, 58' stop short of the free ends 60 of the arm portions 56. However, as seen in FIG. 5(a), even more relative movement between the spring elements 62 can be provided by allowing the slots 58, 58' to extend completely through the free ends 60 of the arm portions 56.

Figure 6:
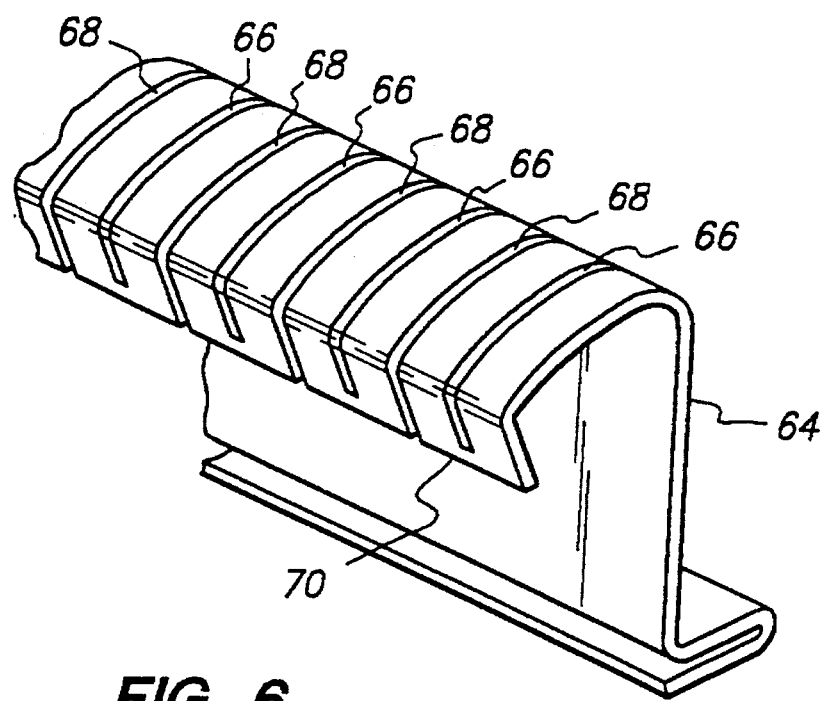
FIG. 6 is a perspective view of a portion of the flexible circuitry for use in conjunction with, for example, the biasing member shown in FIG. 5.

FIG. 6 illustrates one possible configuration for the flexible circuitry that can be attached to the biasing member 54 shown in FIG. 5. FIG. 6 illustrates the flexible circuitry 64 that is to be positioned on one side of the biasing member 54 and it is to be understood that a similar flexible circuitry can be positioned on the other half of the biasing member 54. As in the case of the flexible circuitry 26 illustrated in FIG. 1, the flexible circuitry 64 illustrated in FIG. 6 preferably includes a plurality of generally parallel-spaced electrical conductors 66 (which can be comprised of pairs of electrical contacts that are interconnected by traces). In addition, the flexible circuitry 64 is provided with a plurality of slits or slots 68. The slits or slots 68 are preferably positioned between adjacent electrical conductors 66, although the slits or slots 68 could be positioned between every second or third electrical conductor 66 (or any other number of electrical conductors). As illustrated in FIG. 6, the slits or slots 68 extend up to and through the free end 70 of the flexible circuitry 64. However, if desired, the slits or slots 68 could also stop short of the free end 70 of the flexible circuitry 64 so that the free end 70 of the flexible circuitry is unitary.

The flexible circuitry 64 illustrated in FIG. 6 could be mounted on the biasing member 54 depicted in FIG. 5 so that the electrical conductors 66 on the flexible circuitry 64 are aligned with the individual spring elements 62 on the biasing member 54. As a result, individual ones of the electrical conductors 66 will be able to move relative to adjacent electrical conductor 66 and thereby provide compliant contact with the electrical contacts on the daughterboard or plug-in board. In that way, the resulting connector assembly will be capable of compensating for variations in the positioning and location of the electrical contacts on the daughterboard or plug-in board. Thus, much better electrical connection can be achieved between the corresponding contacts and conductors, thereby reducing the possibility that a failure will occur.

It is to be understood that the combination of the biasing member 54 shown in FIG. 5 and the flexible circuitry 64 shown in FIG. 6 could be modified slightly depending upon the requirements of a particular application. For example, the biasing member 54 shown in FIG. 5 could be employed in connection with flexible circuitry which does not possess the slits or slots 68 illustrated in FIG. 6. In that situation, the flexible circuitry would extend over and cover the slots 58 in the biasing member 54. Further, the electrical conductors on the flexible circuitry would be located between the slots 58 on the biasing member 54. Alternatively, the flexible circuitry 64 shown in FIG. 6 could be used in conjunction with a solid biasing member which does not possess the slots 58 illustrated in FIG. 5. To better understand and appreciate the advantages associated with this latter alternative of providing slots or slits only in the flexible circuitry, reference is made to FIGS. 14 and 15.

FIGS. 14 and 15 depict a greatly enlarged cross-sectional view of flexible circuitry 112 having electrical conductors disposed thereon. Each of the drawings figures illustrates three of the generally parallel-spaced electrical conductors 114, 116, 118. FIG. 14 in particular illustrates the flexible circuitry 112 which is not provided with any slits or slots. Since the flexible circuitry 112 is comprised of a single uninterrupted piece, a force $F_1$ applied to the intermediate electrical conductor 114 by the corresponding electrical contact on the printed circuit board like member will influence the adjacent electrical conductors 116, 118. More particularly, the force $F_1$ applied to the electrical conductor 114 is transferred into the compliant substrate (e.g., polyimide and acrylic adhesive) that is positioned between the electrical conductors 114, 116, 118 and the biasing member when the flexible circuitry is secured to the biasing member. Upon application of the force $F_1$, the substrate material surrounding the electrical conductors 116, 118 tends to pull back or restrain movement of the intermediate electrical conductor 114 as well as the material surrounding the intermediate electrical conductor 114. As a result, less movement of the intermediate electrical conductor 114 is possible. Moreover, the movement of the intermediate electrical conductor 114 is not independent from movement of the adjacent electrical conductors 116, 118. Indeed, the application of the force $F_1$ to the intermediate electrical conductor 114 causes similar movement of the adjacent electrical conductors 116, 118 which may be undesirable depending upon the relative positioning of the electrical contacts on the printed circuit board like member that are to be electrically mated with the electrical conductors 116, 118 on the flexible circuitry 112.

FIG. 15 illustrates the flexible circuitry 112 that has been provided with slits or slots 120 between adjacent electrical conductors 114, 116 and 114, 118. In this situation, when a force $F_2$ is applied to the intermediate electrical conductor 114, the force is transferred to the underlying compliance substrate. However, in this case, the compression of the substrate material underlying the electrical conductor 114 is not restrained or pulled back by the substrate material surrounding the adjacent electrical conductors 116, 118. Thus, each of the individual electrical conductors 114, 116, 118 is able to move independent of adjacent electrical conductors, thereby allowing each of the individual electrical conductors 114, 116, 118 to conform or comply more readily with respect to the electrical contact on the printed circuit board like member to which it is to be electrically mated.

Figure 7:
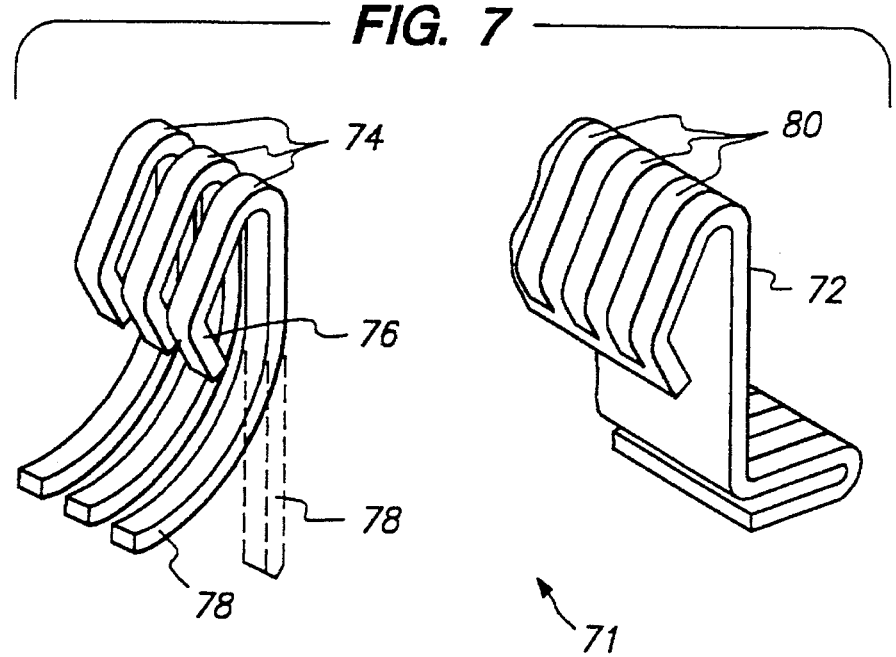
FIG. 7 is an exploded perspective view illustrating the biasing member and flexible circuitry forming a connector assembly in accordance with another embodiment of the present invention.
Figure 8:
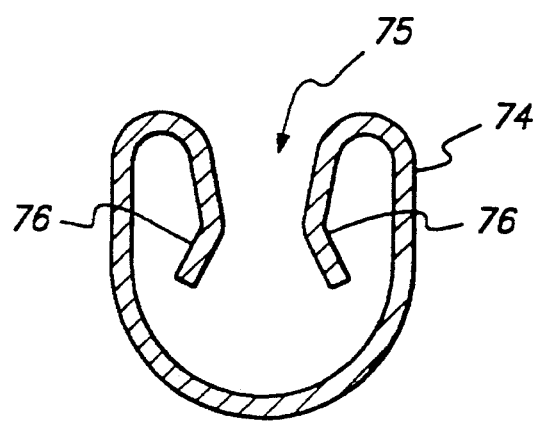
FIG. 8 is a cross-sectional view of one form of the spring elements comprising the biasing member illustrated in FIG. 7.
Figure 9:
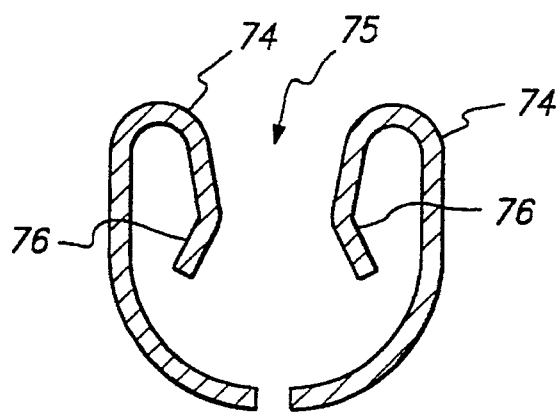
FIG. 9 is a cross-sectional view of another form of the spring elements comprising the biasing member illustrated in FIG. 7.

FIG. 7 illustrates another embodiment of a connecting assembly in accordance with the present invention. As illustrated in FIG. 7, the connector assembly 71 can include flexible circuitry 72 that is mounted on spring means defined by a series of separate and individual biasing members 74. As illustrated in FIG. 8, each of the biasing members 74 can have the same generally C-shaped overall configuration as the biasing members illustrated in FIGS. 1 and 5. Alternatively, as seen in FIG. 9, each of the biasing members 74 can be configured to possess one-half of the C-shaped overall configuration of the biasing member illustrated in FIGS. 1 and 5. In either case, the biasing members 74 can be mounted in a plastic mounting block similar to that illustrated in FIG. 1, or may be directly mounted on the printed circuit board-like member (e.g., the motherboard or backplane board). As a further alternative, the leg portions 78 of each of the biasing members 74 can be straightened as shown in the dotted line configuration of FIG. 7. The straightened leg portion can then be mounted directly on the printed circuit board-like member (e.g., the motherboard or backplane board) or can be mounted on a mounting block similar to that illustrated in FIG. 1.

The flexible circuitry 72 is provided with generally parallel-spaced electrical conductors 80 which are aligned with the individual biasing members 74 when the flexible circuitry 72 is mounted on the biasing members 74. The individualized nature of the biasing members 74 helps ensure that individual ones of the electrical conductors 80 on the flexible circuitry 72 can move relative to adjacent electrical conductors 80. In that way, the resulting connector assembly is able to compensate for variations in the positioning of the electrical contacts on the daughterboard or plug-in board that is inserted into the opening 75 (see FIGS. 8 and 9) between the arm portions 76 of the connector assembly 71.

FIG. 10 illustrates another aspect of the present invention. In this embodiment, a male connector plug 82 is illustrated. The connector plug 82 is adapted to be mounted on a printed circuit board-like member 84 such as a motherboard or backplane board. The connector plug 82 is intended to be used in conjunction with a female connector receptacle configured in a manner similar to the connector element 22 illustrated in FIG. 1. Such a female connector receptacle would be mounted on another printed circuit board-like member such as a daughterboard or plug-in board.

The male connector plug 82 illustrated in FIG. 10 includes a base member 86 comprised of a base 88 and an upstanding support member 90. An enlarged protuberance 92 can be provided at the upper end of the support member 90. The connector plug 82 further includes a biasing element 94 having characteristics similar to the biasing elements described above in connection with the other embodiments. Also, flexible circuitry 96 having characteristics similar to those described above in connection with the other embodiments is secured to the biasing element 94.

The biasing element 94 is illustrated in more detail in FIG. 13 and includes a generally U-shaped member having spaced apart sides 97 and outwardly extending wings 98. The outwardly extending wings 98 intersect the generally U-shaped biasing element 94 at angled corners 100. The biasing element 94 is also provided with a series of slots or slits 102 which, as described in more detail below, provide for a more compliant and resilient biasing member 94.

The flexible circuitry 96 which is positioned on the biasing element 94 includes sides 99 that overlie the sides 97 of the biasing element 94. As seen in FIG. 11 which illustrates more details concerning the flexible circuitry 96 that is employed in the male connector plug depicted in FIG. 10, the flexible circuitry 96 includes a plurality of generally parallel-spaced electrical conductors 104 which are separated by a plurality of slots or slits 106. As illustrated in FIG. 11, the slots or slits 106 can extend all the way to the tip end 108 of the connector plug 82. In addition, the slots or slits 106 can extend along the oppositely facing side of the flexible circuitry 96 to provide a continuous slit or slot between points P, P' as seen in FIG. 10.

FIG. 12 illustrates another alternative manner of providing compliance in the flexible circuitry 96. As seen in FIG. 12, the flexible circuitry 96 can be provided with slits or slots 110 having a length which stops short of the tip end 108 of the connector plug 82. The oppositely facing side of the flexible circuitry 96 can be provided with a similar arrangement of slits or slots 110 disposed between adjacent electrical conductors 104.

FIGS. 11 and 12 illustrate the slits or slots 106, 110 being located between each pair of electrical conductors 104.

However, it is to be understood that the slits or slots 106, 110 could be provided between every second or third electrical conductor 104 (or any number of electrical conductors) if desired.

The combination of the flexible circuitry 96 and the biasing member 94 mounted on the base member 86 allows individual ones of the electrical conductors 104 to move relative to adjacent electrical conductors. The flexible circuitry 96 is preferably disposed on the biasing member 94 such that the electrical conductors 104 are disposed between slits or slots 102 on the biasing member 94. When a female connector receptacle similar to the connector element 22 illustrated in FIG. 1 is mated with the male connector plug 82 shown in FIG. 10, the electrical conductors on the connector receptacle will electrically mate with the electrical conductors 104 on the connector plug 82. In addition, the slits or slots 106, 110 in the flexible circuitry in combination with the slits or slots 102 in the biasing member 94 will allow compliance of the adjacent electrical conductors 104 relative to one another. That is, individual ones of the electrical conductors on the flexible circuitry 96 will be capable of movement relative to adjacent electrical conductors. The space 95 located between the upstanding support member 90 and the connector plug 82 will help contribute to this individualized movement of the electrical conductors by allowing the electrical conductors and the underlying slotted biasing member to assume a position represented by the dotted line configuration shown in FIG. 10.

Figure 16:
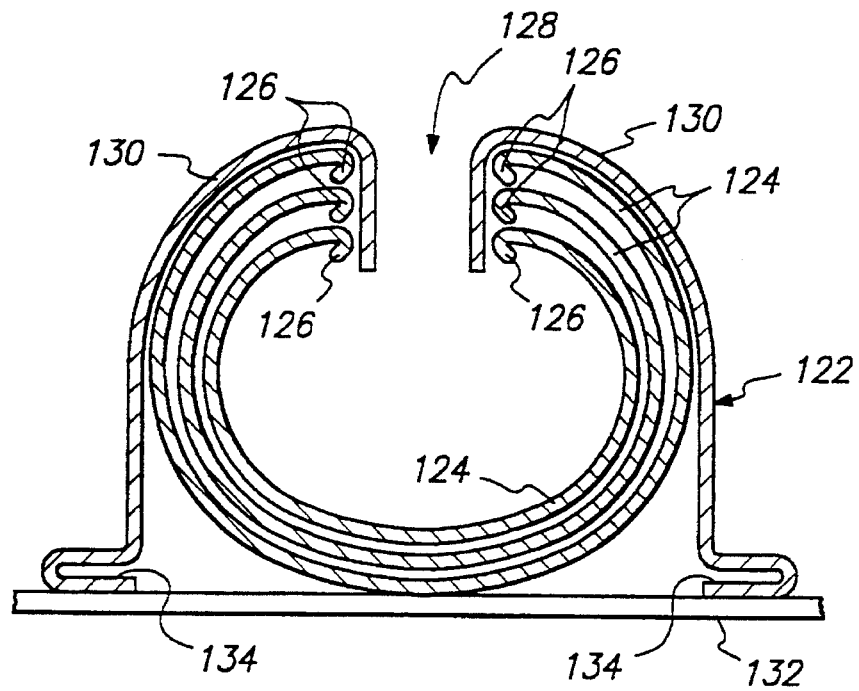
FIG. 16 is a cross-sectional view of another embodiment of the connector assembly according to the present invention.
Figure 17:
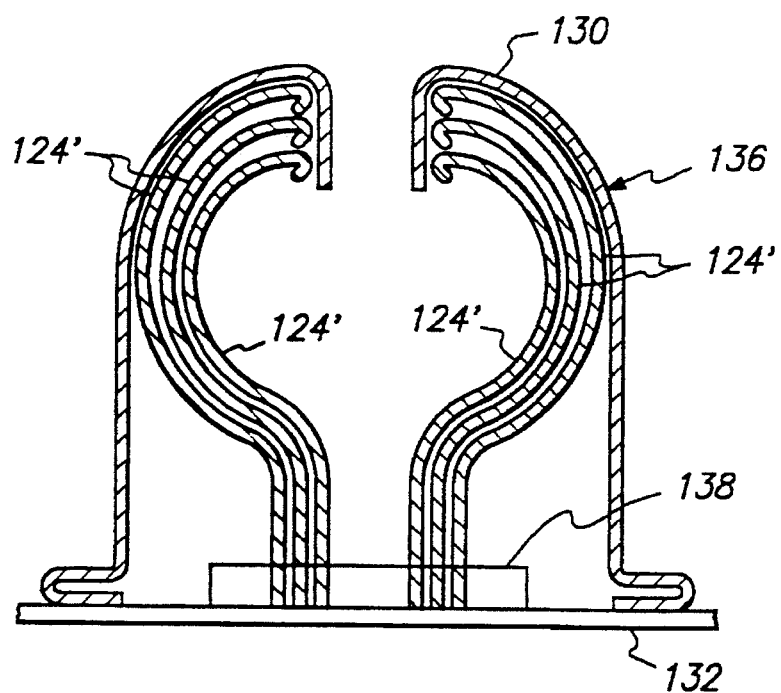
FIG. 17 is a cross-sectional view of another embodiment of the connector assembly according to the present invention.

FIGS. 16 and 17 illustrate another embodiment of a connector assembly according to the present invention. With reference initially to FIG. 16, the connector assembly 122 includes three spring-like resilient biasing members 124 that are nested within one another. Each of the biasing members 124 is elongated in substantially the same manner as the biasing member illustrated in FIG. 5, for example. The oppositely positioned arm portions of each of the biasing members 124 are provided with turned free ends 126. The turned free ends 126 of each of the biasing members 124 are spaced apart to define a generally longitudinally extending opening 128 that extends along the length of the connector assembly 122 and that is adapted to receive a printed circuit board like member (e.g., a daughterboard or plug-in board). The turned free ends 126 define contact locations for bearing against the printed circuit board like member that is received in the opening 128.

The connector assembly 122 also includes flexible circuitry 130 attached to and disposed around the biasing members 124. Although not specifically illustrated in FIG. 16, the flexible circuitry 130 is provided with a plurality of generally parallel-spaced electrical conductors similar to those described above in connection with the various other embodiments.

The biasing members 124 can be directly connected to a printed circuit board like member (e.g., a motherboard or backplane board) 132 in any suitable manner. Alternatively, the biasing members 124 can be attached to a suitable mounting block such as that illustrated in FIG. 1 which in turn is connected to the printed circuit board like member. The flexible circuitry 130 is provided with leads 134 for being electrically mated with appropriate lands or pads on the printed circuit board like member 132 in order to establish electrical interconnection between the electrical conductors on the flexible circuitry 130 and the electrical contacts on the printed circuit board like member 132.

In use, when a printed circuit board like member (e.g., a daughterboard or plug-in board) is inserted into the longitudinal opening 128 in the connector assembly 122, each of the nested biasing members 124 acts independently of one another to help insure a positive and effective electrical mating of the electrical conductors on the flexible circuitry 130 and the electrical contacts on the printed circuit board like member. Further, the arrangement illustrated in FIG. 16 allows for a much higher contact density. That is, the electrical contacts on the printed circuit board like member can be increased or staggered in elevational relation to one another.

The embodiment of the connector assembly 136 illustrated in FIG. 17 is similar to the connector assembly 122 illustrated in FIG. 16 except that each of the biasing members is defined by a pair of oppositely positioned biasing elements 124'. Each of the biasing elements 124' has an end portion that is mounted in a plastic mounting block 138. The plastic mounting block 138 is secured to the printed circuit board like member (e.g., motherboard or back plane board) 132. In all other respects, the connector assembly 136 shown in FIG. 17 is similar to the connector assembly 122 shown in FIG. 16 and is capable of achieving similar advantages during use.

FIGS. 18 and 19 illustrate a connector assembly 140 in accordance with another aspect of the present invention. The connector assembly 140 includes a spring-like resilient biasing member 142 provided with arm portions 144 that define a longitudinally extending opening 146 for receiving a printed circuit board like member (e.g., a daughterboard or a plug-in board).

Attached to the biasing member 142 is flexible circuitry 148. The flexible circuitry 148 is provided with a plurality of generally parallel-spaced electrical conductors 150 for electrically mating with the electrical contacts on the printed circuit board like member that is inserted into the longitudinal opening 146. The biasing member 142 can be mounted on a plastic mounting member 152 which is in turn mounted on a printed circuit board like member (e.g., a motherboard or backplane board). Alternatively, the biasing member 142 can be mounted directly on the printed circuit board like member.

The flexible circuitry 148 is provided with leads 154 that are to be soldered to or pressed onto suitable lands or pads on the printed circuit board like member. As seen in FIG. 19, the portion of the flexible circuitry 148 located adjacent the leads 154 (i.e., adjacent the free end of the flexible circuitry) is provided with slits or slots 156. In the preferred embodiment, the slits or slots 156 are disposed between adjacent electrical conductors 150 on the flexible circuitry 148.

The slits or slots 156 allow the electrical conductors 150 in the region adjacent the leads 154 to move relative to one another and thereby provide compliant contact with the pads or lands on the printed circuit board when the leads 154 are soldered to or pressed onto the lands or pads. In that way, each of the electrical conductors 150 can move independently of one another and thereby compensate for variations in elevational height of the lands or pads on the printed circuit board like member.

It is to be understood that the leads 154 shown in FIG. 18 could be configured in a manner similar to the leads 40 shown in FIG. 1. It should also be appreciated that the arrangement of slits or slots on the flexible circuitry shown in FIG. 19 could be used in conjunction with the various other embodiments of the connector assembly and plug discussed above and illustrated in the drawing figures.

Figure 21:
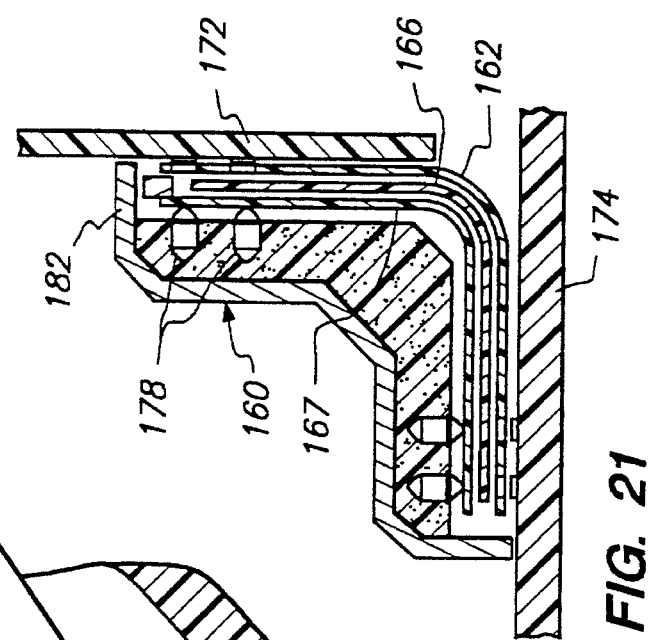
FIG. 21 is a cross-sectional view of the connector assembly shown in FIG. 20.
Figure 20:
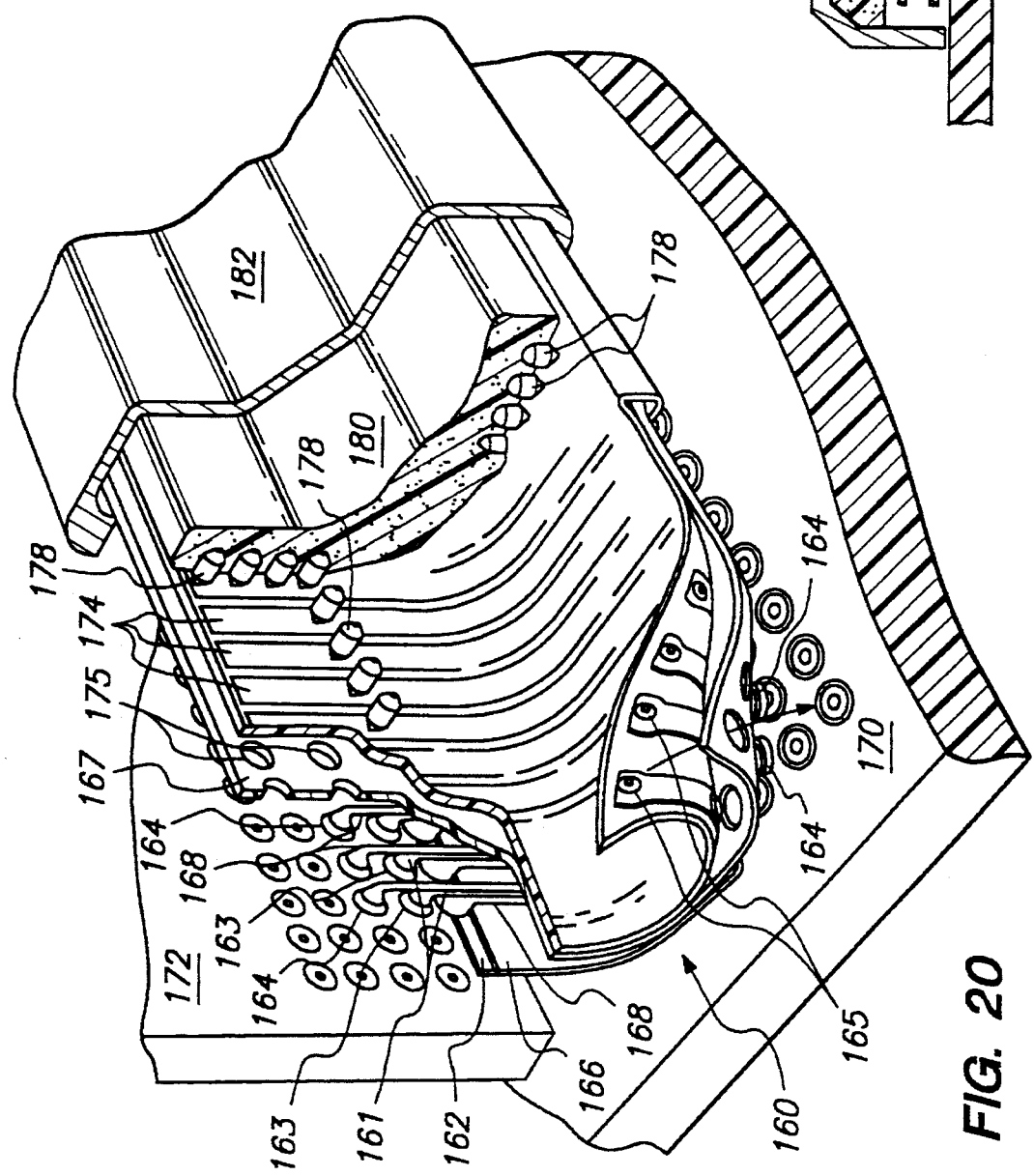
FIG. 20 is a perspective view of a connector assembly in accordance with an additional embodiment of the present invention.

With reference to FIGS. 20 and 21, another embodiment of the connector assembly is illustrated. The connector assembly 160 includes flexible circuitry similar in construction to that described above in connection with the various other embodiments. The flexible circuitry is illustrated in more detail in FIG. 20 than in other illustrated embodiments and includes several insulative layers 162, 166, 167, numerous traces 161 disposed between two of the insulative layers 162, 166, numerous other traces 168 disposed between the other two insulative layers 166, 167, ground traces 174 disposed outside the outermost insulative layer 167, electrical contact elements 163 (e.g., plated buttons) connected to the traces 161, electrical contact elements 164 (e.g., plated buttons) connected to the traces 168, and ground elements connected to the ground traces 174.

The traces 161, 168, 174 are connected to pairs of contact elements so that a contact element which is adapted to be mated with an electrical connector on one printed circuit board like member is interconnected with a contact element that is adapted to be mated with an electrical connector on the other printed circuit board like member. The electrical contact elements 163, 164 provide electrical connection between contacts on the motherboard 170 (or backplane board) and contacts on the daughterboard 172 (or plug-in board). In a known manner, the ground contact elements 165 in conjunction with the ground traces 174 provide interconnection between ground elements on the motherboard 170 (or backplane board) and ground elements on the daughterboard 172 (or plug-in board). Plated through holes 175 are provided at the appropriate places in the insulative layers 162, 166, 167 to ensure contact between the contact elements 165 associated with the ground traces 174 and the ground elements on the motherboard 170 and the daughterboard 172. The ground traces 174 are illustrated as being disposed in a common sheet or layer, but it is to be understood that they could be individually positioned outside the outermost insulative layer 167.

A plurality of individual helical compression coil springs 178 are disposed between the flexible circuitry and a pressure pad 180. Each of the compression coil springs is preferably housed within its own individual housing which may comprise two shell halves between which is located the spring. Each of the individually housed compression springs 178 is positioned in a separate recess provided in the pressure pad 180. In addition, each of the housed compression springs 178 is oriented such that its longitudinal axis is directed towards the daughterboard. The pressure pad 180 helps ensure that sufficient pressure is distributed across the army of springs 178. A coil spring 178 is preferably aligned with each of the contact elements 163, 164, 165 to apply individualized spring forces to each. A housing 182 which is secured to the motherboard 170 can also be provided to serve as an enclosing and supporting structure for the aforementioned various parts. The housing 182 can be made of metal or other appropriate materials.

Although not specifically illustrated in FIGS. 20 and 21, it is to be understood that an arrangement similar to that shown in FIGS. 20 and 21 will be provided on the opposite side of the daughterboard so that the two arrangements together define a connector assembly. Also, as an alternative to providing an enclosing housing 182 for each half of the connector assembly, a single housing structure which encompasses and supports the arrangements on both sides of the daughterboard 172 could be employed.

It can be readily seen that the individual compression springs 178 impart an individualized force to each of the conductor elements or contact elements on the flexible circuitry 162 (i.e., to each of the contact elements or conductor elements 163, 164 associated with the various traces 161, 168 as well as to each of the various ground contact elements 165 associated with the ground traces 174). Thus, just like in the case of the other embodiments discussed above, each of the electrical conductors or contact elements is capable of independent movement relative to other immediately adjacent electrical conductors or contact elements on the flexible circuitry.

Figure 22:
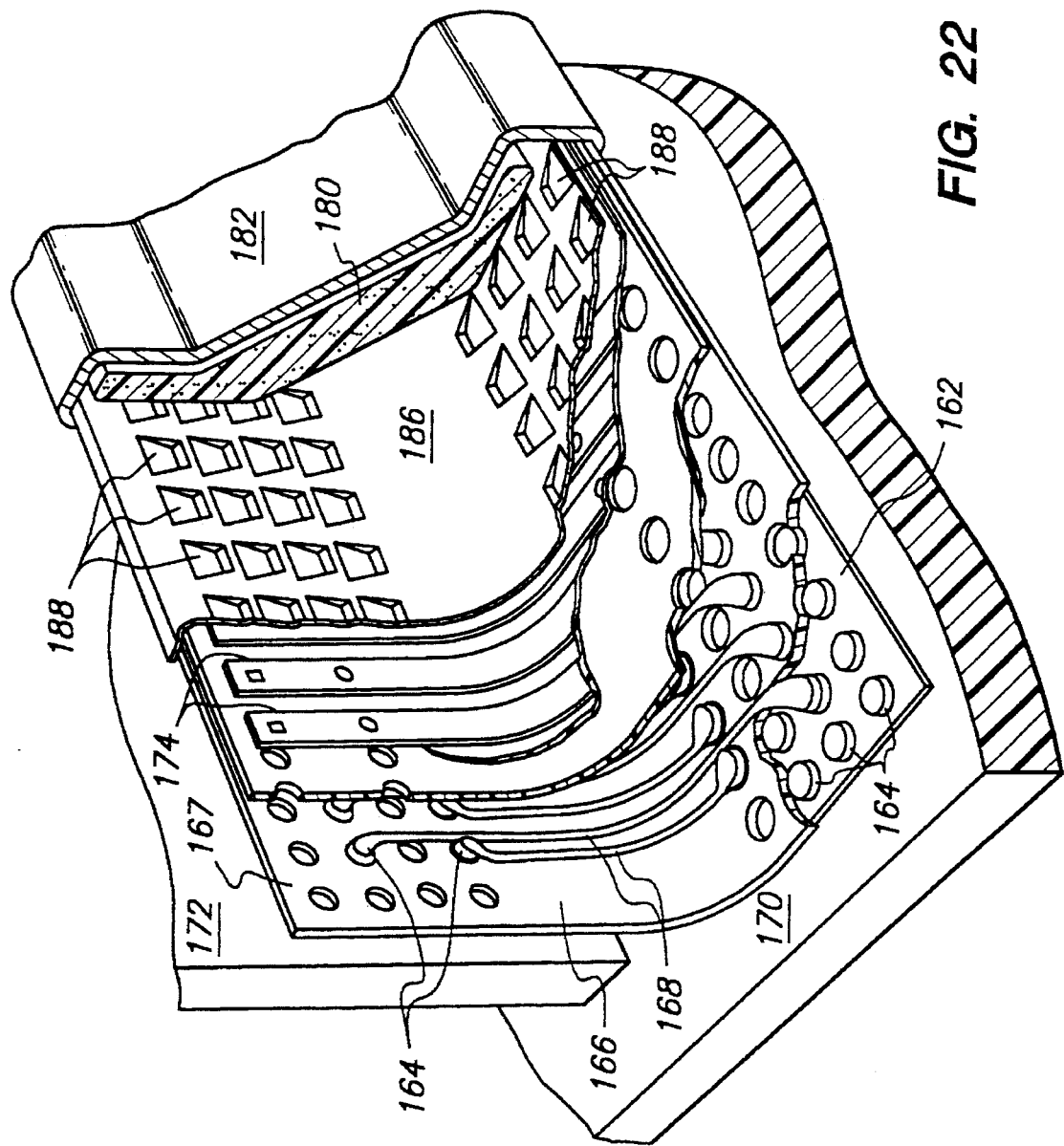
FIG. 22 is a perspective view of a connector assembly in accordance with a further embodiment of the present invention.

FIG. 22 illustrates another embodiment of the connector assembly that is similar to the embodiment depicted in FIGS. 20 and 21. The features that are common to both embodiments are labelled with corresponding reference numerals. In the embodiment shown in FIG. 22, the flexible circuitry is illustrated as being comprised of only two insulative layers 166, 167 positioned on opposite sides of a single layer of traces 168 which are connected to electrical contacts 164. In addition, instead of being provided with compression coil springs, the embodiment shown in FIG. 22 includes a beryllium copper spring member 186 that is provided with a plurality of stamped-out or punched-out cantilevered spring elements 188. This construction is similar to that shown in FIG. 4, except that the flexible circuitry remains intact and is not punched out with each of the individual cantilever springs 188. Each of the cantilevered spring elements imparts an individual biasing force to each of the electrical conductors or contact elements on the flexible circuitry. Thus, as in the case of the previously described embodiments, each of the individual conductor elements on the flexible circuitry is capable of independent movement relative to immediately adjacent electrical conductors.

It is to be understood that the various arrangements described above for providing individualized movement of the electrical conductors on the flexible circuitry could be incorporated into other types of electrical connector assemblies such as that disclosed in U.S. Pat. No. 4,911,643 in which a shape-memory alloy is used to impart certain performance characteristics to the connector.

The principles, preferred embodiments and modes of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents, which fall within the spirit and scope of the present invention as defined in the claims be embraced thereby.

What is claimed is:

1. A connector assembly for being mounted on a first printed circuit board like member to electrically interconnect the first printed circuit board like member to a second printed circuit board like member, comprising: support means for providing a support; flexible circuitry disposed on the support means; said flexible circuitry including generally parallel-spaced individual electrical conductors for being electrically connected to electrical contacts on the first printed circuit board like member, said electrical conductors being positioned to electrically mate with electrical contacts on the second printed circuit board like member when the second printed circuit board like member is mounted on the connector assembly; and portions of said metal support member and portions of said flexible circuitry being punched outwardly in a direction away from the metal support member with respect to surrounding areas of the metal support member and the flexible circuitry, the punched out portions of the flexible circuitry each having at least one of the individual electrical conductors disposed thereon.

\* \* \* \* \*